United States Patent
Park et al.

(10) Patent No.: US 12,385,142 B2
(45) Date of Patent: Aug. 12, 2025

(54) ETCHANT COMPOSITION FOR TITANIUM-CONTAINING METAL LAYER AND ETCHING METHOD USING THE SAME

(71) Applicant: ENF TECHNOLOGY CO., LTD., Yongin-si (KR)

(72) Inventors: Sang Seung Park, Yongin-si (KR); Yang Ryoung Kim, Yongin-si (KR); Bo Yeon Lee, Yongin-si (KR); Min Gyeong Jeong, Yongin-si (KR); Se Hoon Kim, Yongin-si (KR)

(73) Assignee: ENF TECHNOLOGY CO., LTD., Yongin-si (KR)

( * ) Notice: Subject to any disclaimer, the term of this patent is extended or adjusted under 35 U.S.C. 154(b) by 239 days.

(21) Appl. No.: 18/156,969

(22) Filed: Jan. 19, 2023

(65) Prior Publication Data

US 2023/0287574 A1    Sep. 14, 2023

(30) Foreign Application Priority Data

Jan. 21, 2022    (KR) .................. 10-2022-0009097
Dec. 29, 2022    (KR) .................. 10-2022-0188334

(51) Int. Cl.
*C23F 1/40* (2006.01)
*H01L 21/02* (2006.01)
*H01L 21/3205* (2006.01)
*H01L 21/3213* (2006.01)

(52) U.S. Cl.
CPC ............ *C23F 1/40* (2013.01); *H01L 21/0214* (2013.01); *H01L 21/02164* (2013.01); *H01L 21/32051* (2013.01); *H01L 21/32134* (2013.01)

(58) Field of Classification Search
CPC ...... C23F 1/38; C23F 1/40; C23F 1/44; H01L 21/32134
See application file for complete search history.

(56) References Cited

U.S. PATENT DOCUMENTS

| | | | |
|---|---|---|---|
| 2016/0177457 A1* | 6/2016 | Yokomizo | C23F 1/38 252/79.5 |
| 2022/0025299 A1* | 1/2022 | Park | C11D 3/046 |

FOREIGN PATENT DOCUMENTS

| | | |
|---|---|---|
| KR | 20000028870 A | 5/2000 |
| KR | 20110019604 A | 2/2011 |
| KR | 101715932 B1 * | 3/2017 |

OTHER PUBLICATIONS

Millipore Sigma, "Poly(4-styrenesufonic acid) solution" via https://www.sigmaaldrich.com/US/en/product/aldrich/561223?srsltid=AfmBOopoRRVHeRHDKaDr4fQAS1AcgtilgeK5n2crhJafnUdWwxLRF9xm (Year: 2025).*

Millipore Sigma, "Poly(vinyl sulfonic acid, sodium salt) solution" via https://www.sigmaaldrich.com/US/en/product/aldrich/278424?srsltid=AfmBOopVa3mtgYPIT1HOC2DqQyMAXYqnf1cPSeT3k780JhkhuL3LJkGT (Year: 2025).*

* cited by examiner

*Primary Examiner* — Binh X Tran
(74) *Attorney, Agent, or Firm* — McCoy Russell LLP

(57) ABSTRACT

Provided are an etchant composition for a titanium-containing metal layer, and a method using the same, which may selectively etch the titanium-containing metal layer without affecting the quality of other films during a process of manufacturing semiconductor and display devices, and thus, may increase productivity and reliability with improved etching characteristics in a semiconductor manufacturing process.

16 Claims, 1 Drawing Sheet

ETCHANT COMPOSITION FOR TITANIUM-CONTAINING METAL LAYER AND ETCHING METHOD USING THE SAME

CROSS-REFERENCE TO RELATED APPLICATIONS

This application claims priority under 35 U.S.C. § 119 to Korean Patent Application No. 10-2022-0009097, filed on Jan. 21, 2022, and Korean Patent Application No. 10-2022-0188334, filed on Dec. 29, 2022, in the Korean Intellectual Property Office, the disclosure of which is incorporated herein by reference in its entirety.

TECHNICAL FIELD

The following disclosure relates to an etchant composition for a titanium-containing metal layer, and an etching method using the same, and more particularly, to an etchant composition which may selectively etch a titanium-containing metal layer without affecting the quality of other layers in a process of manufacturing semiconductor and display devices, and an etching method using the same.

BACKGROUND

Development of IT technology accelerates high performance and miniaturization of mobile devices such as mobile phones, digital cameras, MP3, and USB memory. Furthermore, smart phones which are currently emerging continue to be developed, aiming for a PC in hand. These products are required to have abilities equivalent to conventional personal computers (PC), and in order to realize it, technology development for a semiconductor device satisfying an ultra-high speed, a large capacity, low power consumption, excellent performance, reliability, and the like is being demanded.

A general semiconductor device is manufactured using one transistor and one capacitor as a unit cell, and the transistor of the semiconductor device generally has a MOS structure. A transistor having the MOS structure includes a structure of a source electrode, a gate electrode, and a drain electrode, and terminals of the source electrode and the drain electrode are made on a silicon substrate and current flows through the terminal. The gate electrode terminal is designed to apply voltage, and Al is mainly used as a metal on an uppermost part and a silicon oxide is usually used as an oxide layer under the metal layer. Here, for smooth current flow between electrodes, the source electrode, the gate electrode, and the drain electrode described above are connected usually using a titanium silicide (TiSi) layer as wiring.

The titanium silicide layer described above is formed by forming a titanium layer on a substrate on which the source electrode, the gate electrode, and the drain electrode are formed and annealing the formed titanium layer. Here, since the substrate is exposed to the atmosphere during the annealing process, the titanium layer may react with oxygen or water vapor to form a titanium oxide layer. The titanium oxide layer formed as such may cause a problem in forming a titanium silicide layer due to a strong bonding force, which may result in a short phenomenon. In addition, as a semiconductor process is complicated and miniaturized, a problem of reliability degradation due to the defects becomes more serious.

Therefore, in order to prevent the defects of a titanium silicide layer, a process of etching a titanium layer is essential after a process of forming a titanium silicide layer.

As a conventional technology, Patent Document 1 discloses an etchant composition formed of a fluoric acid, a periodic acid, and a sulfuric acid, and Patent Document 2 discloses an etchant composition formed of hydrogen peroxide, a fluorine-containing compound, a compound containing both an amino group and a carboxyl group, a nitrate compound, a cyclic amine compound, and water. However, the conventional technologies intend to make etching of a titanium layer efficiently using fluorine, but the effect is not sufficient, and also have problems such as metals other than titanium being simultaneously etched and causing damage to the quality of other layers. Besides, an etchant composition using a buffer or a highly concentrated hydrogen peroxide was suggested as a composition for selectively etching a titanium layer, but the damaged quality of other layers and over-etching of a titanium layer still remain as problems.

Related Art Documents

Patent Documents

Korean Patent Laid-Open Publication KR 10-2000-0028870 A
Korean Patent Laid-Open Publication KR 10-2011-0019604 A

SUMMARY

An embodiment of the present disclosure is directed to providing an etchant composition for a titanium-containing metal layer which has a corrosion prevention effect for the quality of other layers laminated therewith while etching a titanium-containing metal layer at a rapid etching rate.

Another embodiment of the present disclosure is directed to providing an etchant composition which does not cause an over-etching problem of a titanium-containing metal layer and titanium residues during an etching process, so that it may stably etch the titanium-containing metal layer.

Still another embodiment of the present disclosure is directed to providing an etching method of a titanium-containing metal layer with improved productivity and reliability, as excellent etching characteristics for a titanium-containing metal layer and a corrosion prevention effect for the quality of other layers, and a manufacturing method of a semiconductor device.

In one general aspect, an etchant composition for a titanium-containing metal layer includes: a polyvalent phosphonic acid or a salt thereof, an inorganic base, a sulfonic acid-based polymer compound, hydrogen peroxide, and a remaining amount of water.

In an exemplary embodiment of the present disclosure, the sulfonic acid-based polymer compound may have a molecular weight of 10,000 to 50,000 g/mol.

In an exemplary embodiment of the present disclosure, the sulfonic acid-based polymer compound may be included at 0.001 to 0.1 wt %.

In an exemplary embodiment of the present disclosure, the polyvalent phosphonic acid or the salt thereof may be included at 0.01 to 5 wt % with respect to the total weight of the composition.

In an exemplary embodiment of the present disclosure, the inorganic base may be included at 0.1 to 3 wt % with respect to the total weight of the composition.

In an exemplary embodiment of the present disclosure, the sulfonic acid-based polymer compound may be represented by the following Chemical Formula 1:

[Chemical Formula 1]

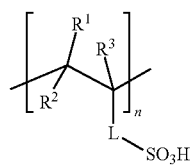

wherein $R^1$ to $R^3$ are independently of one another selected from hydrogen, C1-C7 linear or branched alkyl groups, and halogen elements; L is a direct bond or C1-C10 alkylene, in which —$CH_2$— of the alkylene may be replaced with C6-C12 aryl, —C(=O)—, —NR'—, or a combination thereof, and R' is hydrogen or C1-C7 alkyl; and n is an integer of 30 to 1000.

In an exemplary embodiment of the present disclosure, the etchant composition may include: 0.01 to 3 wt % of the polyvalent phosphonic acid or the salt thereof, 0.5 to 3 wt % of the inorganic base; 0.001 to 0.1 wt % of the sulfonic acid-based polymer compound; 15 to 25 wt % of the hydrogen peroxide; and a remaining amount of water, based on the total weight of the etchant composition.

The etchant composition according to an exemplary embodiment of the present disclosure may further include a phosphate-based compound.

In an exemplary embodiment of the present disclosure, the phosphate-based compound may be included at 0.01 to 2 wt %, based on the total weight of the etchant composition.

In an exemplary embodiment of the present disclosure, a weight ratio between the phosphate-based compound and the inorganic base may be 1:3 to 1:15.

The etchant composition according to an exemplary embodiment of the present disclosure may not include a quaternary ammonium salt.

The etchant composition according to an exemplary embodiment of the present disclosure may have a pH of 7 to 11.

In another general aspect, an etching method includes: bringing the etchant composition described above into contact with a titanium-containing metal layer.

In still another general aspect, a manufacturing method of semiconductor device includes: forming a titanium-containing metal layer on a substrate on which a source electrode, a gate electrode, and a drain electrode have been formed; and etching the metal layer with the etchant composition described above.

The manufacturing method of a semiconductor device according to an exemplary embodiment of the present disclosure may further include, after the forming of a titanium-containing metal layer, forming a silicon insulation layer and a monolayer of one or a multilayer of two or more selected from second metal layers on a part of a surface of the metal layer.

In an exemplary embodiment of the present disclosure, the second metal layer may be a monolayer or a multilayer including one or more metals selected from copper, molybdenum, tungsten, titanium, tantalum, chromium, neodymium, niobium, nickel, indium, and tin.

The manufacturing method of a semiconductor device according to an exemplary embodiment of the present disclosure may further include, after the etching, annealing the titanium-containing metal layer.

Other features and aspects will be apparent from the following detailed description, the drawings, and the claims.

DETAILED DESCRIPTION OF EMBODIMENTS

Figure 1:
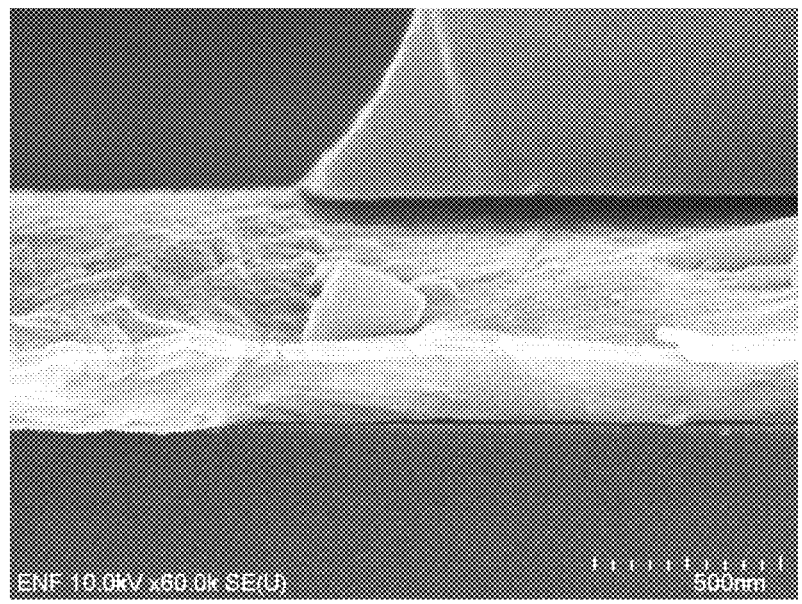
FIG. 1 is a scanning electron microscopic (SEM) image of a copper layer etched by an etchant composition of Comparative Example 1 according to the present disclosure.

Hereinafter, an etchant composition which etches a titanium-containing metal layer without affecting other metal layers during a manufacturing process of semiconductor and display devices, an etching method using the same, and a manufacturing method of a semiconductor device will be described.

Technical terms and scientific terms used herein have the general meaning understood by those skilled in the art to which the present disclosure pertains unless otherwise defined, and a description for the known function and configuration which may unnecessarily obscure the gist of the present disclosure will be omitted in the following description and the accompanying drawings.

The singular form used in the present specification may be intended to also include a plural form, unless otherwise indicated in the context.

In addition, units used in the present specification without particular mention are based on weights, and as an example, a unit of % or ratio refers to a wt % or a weight ratio and wt % refers to wt % of any one component in a total composition, unless otherwise defined.

In addition, the numerical range used in the present specification includes all values within the range including the lower limit and the upper limit, increments logically derived in a form and span in a defined range, all double limited values, and all possible combinations of the upper limit and the lower limit in the numerical range defined in different forms. Unless otherwise defined in the specification of the present disclosure, values which may be outside a numerical range due to experimental error or rounding of a value are also included in the defined numerical range.

In addition, the term "comprise" in the present specification is an open-ended description having a meaning equivalent to the term such as "is/are provided", "contain", "have", or "is/are characterized", and does not exclude devices, materials or processes which are not further listed.

In addition, the term "substantially not include" in the present specification means that other devices, materials, or processes which are not listed together with specified devices, materials, or processes may be present in an amount or a degree which does not have an unacceptable significant influence on at least one basic and novel technical idea of the disclosure.

Hereinafter, the present disclosure will be described in detail.

The etchant composition for a titanium-containing metal layer according to an exemplary embodiment of the present disclosure may include a polyvalent phosphonic acid or a salt thereof, an inorganic base, a sulfonic acid-based polymer compound, hydrogen peroxide, and a remaining amount of water.

Hereinafter, a polyvalent phosphonic acid in the present specification may refer to a polyvalent phosphonic acid and/or a polyvalent phosphonic acid salt. Specifically, the polyvalent phosphonic acid salt may be an alkali metal salt, an alkaline earth metal salt, or an ammonium salt of the polyvalent phosphonic acid. A specific example of the alkali metal salt or the alkaline earth metal salt may be a sodium salt, a potassium salt, a calcium salt, or a magnesium salt. In an exemplary embodiment of the present disclosure, the polyvalent phosphonic acid may include a polyvalent phosphonic acid sodium salt or a polyvalent phosphonic acid potassium salt.

In the etchant composition according to an exemplary embodiment of the present disclosure, the polyvalent phosphonic acid may be included at 0.005 to 5 wt % with respect to the total weight of the composition. Specifically, it may be included at 0.005 to 3 wt %, 0.01 to 3 wt %, 0.01 to 2.5 wt %, or 0.01 to 2 wt %. Here, by including the polyvalent phosphonic acid in the content range, effects of improved etching rate of a titanium layer and improved etching residue washing performance may be provided.

In the present disclosure, the polyvalent phosphonic acid may chelate titanium ions so that titanium ions dissolved in the etchant during etching are not readsorbed on a substrate surface, thereby suppressing the activity of titanium ions. By using the polyvalent phosphonic acid, etching of other metal layers which may occur when using an excessive amount of an organic acid for etching may be minimized. The polyvalent phosphonic acid may be diphosphonic acid, a triphosphonic acid, or a tetraphosphonic acid. Specifically, the diphosphonic acid may be, for example, hydroxyethylidene diphosphonic acid.

Here, the polyvalent phosphonic acid may include an alkali metal salt of the polyvalent phosphonic acid.

In the etchant composition according to an exemplary embodiment of the present disclosure, the inorganic base may serve as a pH adjusting agent, and a non-limiting example of the inorganic base may be selected from sodium hydroxide, potassium hydroxide, sodium carbonate, and the like, and specifically, may be a hydrate.

The inorganic base may be included at 0.1 to 3.0 wt %, 0.5 to 2.8 wt %, 1.0 to 2.8 wt %, or 1.5 to 2.7 wt %, with respect to the total weight of the etchant composition for a metal layer. By including the inorganic base in the range described above, occurrence of titanium residues is prevented, and an effect of suppressing etching of other metals is excellent. The amount of use may be adjusted depending on the pH, but when the inorganic base is added in excess of the above range with respect to the total weight of the composition, an etching rate and a surface uniformity may be decreased, and thus, the amount may not be appropriate.

The sulfonic acid-based polymer compound prevents over-etching of a titanium layer, thereby providing an effect of suppressing poor etching. The sulfonic acid-based polymer compound is a combination of repeating units containing a sulfonic acid group, and may be a polymer of the same repeating unit or a copolymer of different repeating units. The shape forming the copolymerization may be irregular copolymers, alternating copolymers, block copolymers, graft copolymers, and the like. The irregular copolymer has an irregular arrangement in which the arrangement order of monomers such as a first monomer and a second monomer is not set, the alternating copolymer has a form in which each monomer is alternately arranged, the block copolymer has a form in which each monomer forms a block, and the graft copolymer has a form in which one kind of monomers has a skeleton chain structure and another kind of monomers is bonded in a branch form.

The sulfonic acid-based polymer compound may have a molecular weight of 10,000 to 80,000 g/mol, 10,000 to 50,000 g/mol, 15,000 to 40,000 g/mol, or 20,000 to 30,000 g/mol. Here, the molecular weight is based on a number average molecular weight (Mn), unless otherwise particularly mentioned. In this case, a polymer compound may be dissolved well in the etchant, and over-etching may be efficiently suppressed to exert uniform etching characteristics. When the molecular weight is less than 10,000 g/mol, it is difficult to suppress over-etching of a titanium layer, and when the molecular weight is more than the range described above, the polymer compound is not dissolved well in the etchant so that it is widely adsorbed on the substrate to cause defects due to occurrence of residues, which is thus inappropriate.

The sulfonic acid-based polymer compound may be included at 0.001 to 0.1 wt %, specifically 0.01 to 0.1 wt % with respect to the total weight of the composition. In this case, the sulfonic acid functional group chelates a titanium ion, thereby suppressing occurrence of titanium residues and being advantageous for an effect of protecting other metal layers. When the sulfonic acid-based polymer compound is included at more than 0.1 wt %, the stability of the etchant may be deteriorated, which is thus inappropriate.

The sulfonic acid-based polymer compound according to a preferred exemplary embodiment of the present disclosure is a homopolymer and may be represented by the following Chemical Formula 1:

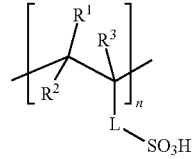

[Chemical Formula 1]

wherein $R^1$ to $R^3$ are independently of one another selected from hydrogen, C1-C7 linear or branched alkyl groups, and halogen elements; L is a direct bond or C1-C10 alkylene, in which —$CH_2$— of the alkylene may be replaced with C6-C12 aryl, —C(=O)—, —NR'—, or a combination thereof, and R' is hydrogen or C1-C7 alkyl; and n is an integer of 30 to 1000.

More specifically, in the sulfonic acid-based polymer compound in Chemical Formula 1, $R^1$ to $R^3$ may be independently of one another hydrogen; L may be a direct bond or C1-C7 alkylene, in which —$CH_2$— may be replaced with C6-C12 aryl, —C(=O)—, —NR'—, or a combination thereof and R' may be hydrogen; and n may be an integer of 40 to 600.

Another form of the sulfonic acid-based polymer compound is a copolymer, and specifically, for example, may be poly(2-acrylamido-2-methyl-1-propanesulfonic acid-co-acrylonitrile)acrylonitrile or poly(4-styrenesulfonic acid-co-maleic acid), but is not limited thereto.

A preferred homopolymer form of the sulfonic acid-based polymer compound may be, for example, poly(4-styrenesulfonic acid) (PSS), poly(anetholesulfonic acid) (PAS), poly(vinylsulfonic acid) (PVS), or poly(2-acrylamido2-methyl-1-propanesulfonic acid) (PAMPS), but is not limited thereto.

Water included in the etchant composition is not particularly limited, but may be specifically deionized water, and more specifically deionized water for a semiconductor process, having a resistivity value of 18 MΩ·cm or more.

The etchant composition according to an exemplary embodiment of the present disclosure may have a small change in pH of a chemical even during a repeated etching process, since stable etching characteristics are implemented. Specifically, the pH of the etchant composition for a titanium layer according to an exemplary embodiment of the present disclosure may be 7 to 11, more specifically 8 to 10.

The etchant composition according to an exemplary embodiment of the present disclosure may satisfy all of the following content ranges. Specifically, the etchant composition may include 0.005 to 3 wt % of the polyvalent phosphonic acid, 0.5 to 3 wt % of the inorganic base, 0.001 to 0.1 wt % of the sulfonic acid-based polymer compound, 15 to 25 wt % of the hydrogen peroxide, and a remaining amount of water, based on the total weight.

More specifically, the etchant composition according to the present disclosure may include 0.01 to 2 wt % of the polyvalent phosphonic acid, 1.5 to 3 wt % of the inorganic base, 0.01 to 0.1 wt % of the sulfonic acid-based polymer compound, 15 to 23 wt % of hydrogen peroxide, and a remaining amount of water.

The etchant composition according to an exemplary embodiment of the present disclosure may further include a phosphate-based compound. Specifically, the phosphate-based compound may be included at 0.01 to 1 wt % or 0.05 to 0.5 wt %, based on the total composition. The phosphate may include monosodium phosphate ($NaH_2PO_4$), disodium phosphate ($Na_2HPO_4$), trisodium phosphate ($Na_3PO_4$), monopotassium phosphate ($KH_2PO_4$), dipotassium phosphate ($K_2HPO_4$), monoammonium phosphate (($NH_4$)$H_2PO_4$), diammonium phosphate (($NH_4$)$_2HPO_4$), triammonium phosphate (($NH_4$)$_3PO_4$), or a combination of two or more thereof. Preferably, the phosphate may be monopotassium phosphate ($KH_2PO_4$), dipotassium phosphate ($K_2HPO_4$), or a combination thereof. In this case, an etching rate may be adjusted so that uniform etching may proceed.

The etchant composition according to an exemplary embodiment of the present disclosure may have a content ratio between the phosphate-based compound and the inorganic base of specifically 1:3 to 1:15, more specifically 1:5 to 1:12 by weight.

More specifically, the etchant composition according to the present disclosure may include 0.01 to 2 wt % of the polyvalent phosphonic acid, 1.5 to 3 wt % of the inorganic base, 0.01 to 0.1 wt % of the sulfonic acid-based polymer compound, 15 to 23 wt % of the hydrogen peroxide, 0.1 to 1 wt % of the phosphate-based compound, and a remaining amount of water. Since the etchant is combined at the appropriate mixing ratio described above, the present disclosure does not cause over-etching of a titanium layer while suppressing etching of other metal films as much as possible, thereby providing an excellent etching selectivity.

In addition, the etchant composition according to an exemplary embodiment of the present disclosure may not substantially include a quaternary ammonium salt. When the etchant composition includes the quaternary ammonium salt, an etching rate for a titanium layer is rapidly improved and causes over-etching, which is thus not preferred. For example, the quaternary ammonium salt may be tetraalkylammonium hydroxide, trialkylarylammonium hydroxide, and the like, and specifically, may be tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, or methyltributylammonium hydroxide, but is not limited as long as it has the embodiment of the quaternary ammonium salt. Here, the alkyl may be C1-C8 alkyl and the aryl may be C6-C12 aryl.

In the etchant composition according to an exemplary embodiment of the present disclosure, an object to be etched by the etchant composition is a pure titanium layer. According to the present disclosure, etching or damage of the upper layer or the lower layer represented by a silicon insulation layer, a copper-based metal layer, or the like other than the titanium layer does not occur. Therefore, poor electrical device characteristics, for example, short circuit, poor wiring, reduced luminance, and the like, which may occur during a subsequent process may be effectively prevented.

The silicon insulation layer may be one or a combination of two or more selected from a silicon nitride layer, a silicon oxide layer, and the like.

As an example, the silicon nitride may be a $SiN_x$ layer, a SiON layer, a doped $SiN_x$ layer (doped SiN layer), or the like.

As an example, the silicon oxide may be a spin on dielectric (SOD) layer, a high density plasma (HDP) layer, a thermal oxide layer, a borophosphate silicate glass (BPSG) layer, a phosphosilicate glass (PSG) layer, a borosilicate glass (BSG) layer, a polysilazane (PSZ) layer, a fluorinated silicate glass (FSG) layer, a low pressure tetraethyl ortho-silicate (LP-TEOS) layer, a plasma enhanced tetraethyl ortho silicate (PETEOS) layer, a high temperature oxide (HTO) layer, a medium temperature oxide (MTO) layer, an undoped silicate glass (USG) layer, a spin on glass (SOG) layer, an advanced planarization layer (APL), an atomic layer deposition (ALD), a plasma-enhanced (PE) oxide layer, O3-tetraethyl ortho silicate (O3-TEOS), or the like.

The copper-based metal layer may be a monolayer formed of copper or a copper alloy; or a multilayer in which two or more of the monolayers are laminated.

As an example, the copper alloy is not limited as long as it is a metal used in an electrode of a semiconductor device, and a non-limiting example thereof may be one or two or more selected from molybdenum, tungsten, titanium, tantalum, chromium, neodymium, niobium, nickel, indium, tin, and the like.

In addition, the present disclosure will describe a use of the etchant composition for a titanium-containing metal layer described above.

An exemplary embodiment of the present disclosure may be an etching method of a titanium-containing metal layer including: bringing the etchant composition into contact with a titanium-containing metal layer.

In addition, an exemplary embodiment of the present disclosure may be a manufacturing method of a semiconductor device including: forming a titanium-containing metal layer on a substrate on which a source electrode, a gate electrode, and a drain electrode have been formed; and etching the metal layer using the etchant composition described above.

According to the present disclosure, in selectively etching a titanium layer used as a metal layer for preventing diffusion of a semiconductor device, etching both an upper layer and a lower layer which may be exemplified by a silicon wafer, a silicon insulation layer, a copper-based metal layer, and the like is effectively prevented, and only the titanium layer may be selectively etched. In addition, since readsorption of titanium ions which may occur during an etching process is prevented and titanium ions may be stably dissolved in a chemical, titanium residues which may occur therefrom may be efficiently removed, and thus, damage of the upper layer or the lower layer may be minimized. Thus, according to the present disclosure, electrical or physical defects which may occur in an etching process are minimized, thereby implementing stable device characteristics. In addition, it is commercially very advantageous.

The manufacturing method of a semiconductor device according to an exemplary embodiment of the present disclosure may further include, after the forming of a titanium-containing metal layer, forming a silicon insulation layer and a monolayer of one or a multilayer of two or more selected from second metal layers on a part of a surface of the metal layer.

The metal layer may be a copper-based metal layer, and the copper-based metal layer may be a monolayer formed of copper or a copper alloy or a multilayer in which two or more of the monolayers are laminated, and the copper alloy may include one or two or more selected from molybdenum, tungsten, titanium, tantalum, chromium, neodymium, niobium, nickel, indium, tin, and the like, in addition to copper.

The manufacturing method of a semiconductor device according to an exemplary embodiment of the present disclosure may further include, after the etching, annealing the titanium-containing metal layer. A titanium silicide layer may be formed by the step, and cracks which may occur in the annealing may not be caused by performing the etching step according to the present disclosure. That is, according to the present disclosure, a titanium silicide layer having improved performance may be provided.

Hereinafter, the etchant composition for a titanium-containing metal layer according to the present disclosure will be described in more detail by the following examples. However, the following examples are only a reference for describing the present disclosure in detail and the present disclosure is not limited thereto, and may be implemented in various forms.

Examples 1 to 10, and Comparative Examples 1 to 5

Etchant compositions (8 kg) having the components and the contents listed in Table 1 were prepared.

TABLE 1

| Unit (wt %) | Polyvalent phosphonic acid | | Phosphate-based compound | | Sulfonic acid-based polymer compound (molecular weight) | | Inorganic base | | Hydrogen peroxide | Water |
|---|---|---|---|---|---|---|---|---|---|---|
| Example 1 | HEDP | 0.01 | — | — | PSS(30,000) | 0.05 | KOH | 2.5 | 20 | Remaining amount |
| Example 2 | HEDP | 0.10 | — | — | PAS(30,000) | 0.05 | KOH | 2.5 | 20 | Remaining amount |
| Example 3 | HEDP | 0.50 | — | — | PVS(30,000) | 0.05 | KOH | 2.5 | 20 | Remaining amount |
| Example 4 | HEDP | 1.00 | — | — | PAMPS(25,000) | 0.05 | KOH | 2.5 | 20 | Remaining amount |
| Example 5 | HEDP | 0.50 | $K_2HPO_4$ | 0.5 | PSS(30,000) | 0.07 | KOH | 2.5 | 20 | Remaining amount |
| Example 6 | HEDP | 0.50 | $K_2HPO_4$ | 0.5 | PAS(30,000) | 0.05 | KOH | 2.5 | 20 | Remaining amount |
| Example 7 | HEDP | 0.50 | $K_2HPO_4$ | 0.5 | PVS(30,000) | 0.05 | KOH | 2.5 | 20 | Remaining amount |
| Example 8 | HEDP | 0.50 | $K_2HPO_4$ | 0.5 | PAMPS(25,000) | 0.05 | KOH | 2.5 | 20 | Remaining amount |
| Example 9 | HEDP | 0.50 | $K_2HPO_4$ | 0.5 | PSS(30,000) | 0.05 | KOH | 2.5 | 20 | Remaining amount |
| Example 10 | HEDP | 0.1 | $K_2HPO_4$ | 0.5 | PAMPS(25,000) | 0.05 | KOH | 2.5 | 20 | Remaining amount |
| Comparative Example 1 | HEDP | 1.50 | — | — | Poly-EG | 0.05 | KOH | 2.5 | 20 | Remaining amount |
| Comparative Example 2 | HEDP | 0.50 | $K_2HPO_4$ | 0.5 | — | — | KOH | 2.5 | 20 | Remaining amount |
| Comparative Example 3 | HEDP | 0.50 | $K_2HPO_4$ | 0.5 | Poly-EG | 0.1 | KOH | 2.5 | 20 | Remaining amount |
| Comparative Example 4 | HEDP | 0.50 | $K_2HPO_4$ | 0.5 | PSS(30,000) | 0.05 | — | — | 20 | Remaining amount |
| Comparative Example 5 | — | — | $K_2HPO_4$ | 0.5 | PSS(30,000) | 0.05 | KOH | 2.5 | 20 | Remaining amount |

HEDP: 1-hydroxyethylidene-1,1-diphosphonic acid (etidronic acid)
PSS: poly(4-styrenesulfonic acid)
PAS: poly(anetholesulfonic acid)
PVS: poly(vinylsulfonic acid)
PAMPS: poly(2-acrylamido-2-methyl-1-propanesulfonic acid)
EG: ethylene glycol
PG: propylene glycol
BG: butylene glycol
EG-monomethyl ether: ethylene glycol monoethyl ether
EG-dimethyl ether: ethylene glycol diethyl ether
Poly-EG: polyethylene glycol
KOH: potassium hydroxide Evaluation Method 1. Etching Characteristics A substrate in which a titanium layer (600 Å), a silicon oxide layer (600 Å), and a copper layer (600 Å) were deposited, respectively, as a monolayer on a silicon wafer (600 Å) was prepared. A glass in which a pattern was formed by applying a photoresist process having a certain pattern thereon was cut into 5×5 cm using a diamond knife to prepare a specimen.

Etchant compositions according to the content combinations described in the examples and the comparative examples of Table 1 were prepared to be 8 kg. Each etchant composition prepared was placed in spray etching type experimental equipment, heating was performed by setting the temperature to 32° C., and an etching process was performed when the temperature was reached. A total etching time was based on an end point detection (EPD) and an over-etching was 100%. Thereafter, washing with distilled water was performed three times, each change in a film thickness was confirmed by Ellipsometer (SE-MG-1000), and etching characteristics were evaluated.

2. Titanium Residue Level

The specimen obtained by the method of evaluating etching characteristics was used to evaluate a titanium residue level, according to the following criteria:

[Criterion 1] Titanium Residue Level

No residue: ○

1 to 10 residues: Δ

More than 10 residues/bundle: x

3. Whether metal layer (copper layer) was etched

The specimen obtained by the method of evaluating etching characteristics was used to evaluate whether other metal layers (copper layer) were etched, according to the following criteria:

[Criterion 2] Etching Rate of Other Metal Layers (Copper Layer)

No etching: ○

In a range of 1 Å/min to 20 Å/min: Δ

More than 20 Å/min: x

TABLE 2

| | Ti (ppm) | Etching characteristics (100% OE ≤ 0.3 μm) | Titanium residue level | Whether other metal layers were etched |
|---|---|---|---|---|
| Example 1 | 0 | 0.20 | ○ | ○ |
| | 300 | 0.20 | | |
| | 600 | 0.22 | | |
| Example 2 | 0 | 0.22 | ○ | ○ |
| | 300 | 0.21 | | |
| | 600 | 0.21 | | |
| Example 3 | 0 | 0.23 | ○ | ○ |
| | 300 | 0.23 | | |
| | 600 | 0.22 | | |
| Example 4 | 0 | 0.21 | ○ | ○ |
| | 300 | 0.19 | | |
| | 600 | 0.19 | | |
| Example 5 | 0 | 0.25 | ○ | ○ |
| | 300 | 0.24 | | |
| | 600 | 0.23 | | |
| Example 6 | 0 | 0.25 | ○ | ○ |
| | 300 | 0.25 | | |
| | 600 | 0.24 | | |
| Example 7 | 0 | 0.23 | ○ | ○ |
| | 300 | 0.22 | | |
| | 600 | 0.22 | | |
| Example 8 | 0 | 0.24 | ○ | ○ |
| | 300 | 0.23 | | |
| | 600 | 0.24 | | |
| Example 9 | 0 | 0.23 | ○ | ○ |
| | 300 | 0.25 | | |
| | 600 | 0.24 | | |
| Example 10 | 0 | 0.21 | ○ | ○ |
| | 300 | 0.19 | | |
| | 600 | 0.19 | | |

TABLE 3

| | Ti (ppm) | Etching characteristics (occurrence of over-etching) | Titanium residue level | Whether other metal layers were etched |
|---|---|---|---|---|
| Comparative Example 1 | 0 | 0.20 | ○ | Δ |
| | 300 | 0.32 | | |
| | 600 | 0.48 | | |
| Comparative Example 2 | 0 | 0.35 | ○ | ○ |
| | 300 | 0.38 | | |
| | 600 | 0.41 | | |
| Comparative Example 3 | 0 | 0.38 | ○ | ○ |
| | 300 | 0.38 | | |
| | 600 | 0.40 | | |
| Comparative Example 4 | 0 | unetch | x | x |
| | 300 | unetch | | |
| | 600 | unetch | | |
| Comparative Example 5 | 0 | 0.40 | x | ○ |
| | 300 | 0.36 | | |
| | 600 | 0.31 | | |

Figure 2:
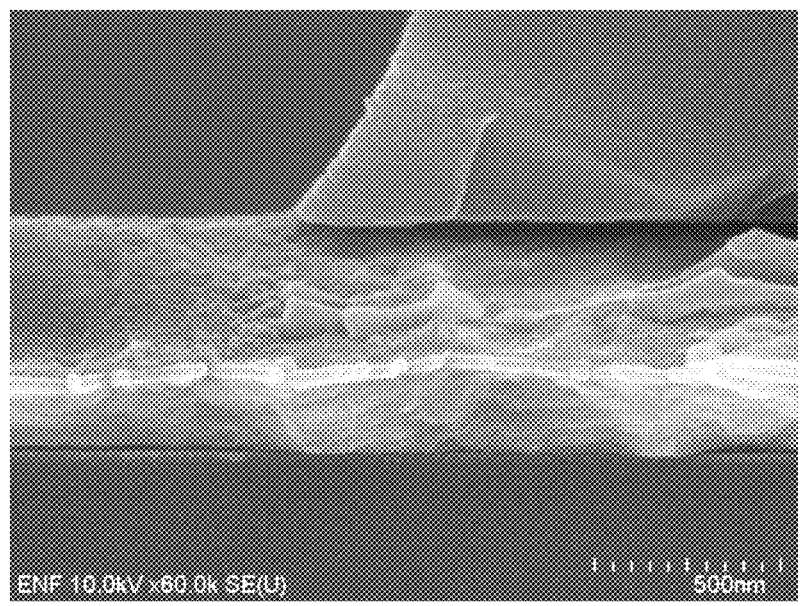
FIG. 2 is a scanning electron microscopic (SEM) image of a copper layer which was etched by an etchant composition of Example 1 according to the present disclosure.

Referring to Table 2, in the examples using the etchant composition including 0.01 to 3 wt %0 of the polyvalent phosphonic acid, 0.5 to 3 wt %⁰ of the inorganic base, 0.01 to 0.1 wt %0 of the sulfonic acid-based polymer compound, 15 to 25 wt %0 of the hydrogen peroxide, and a remaining amount of water according to the present disclosure, over-etching of a titanium layer did not occur even though over-etching was performed at 10000 in all cases. In addition, there was no titanium residue, and as shown in FIG. 2, considering that no etching of a copper layer was shown, it was confirmed that an effect of protecting other metal layers was excellent and selectivity was excellent.

However, the etchant compositions of the comparative examples shown in Table 3 caused over-etching in all cases except Comparative Example 4, when the over-etching was performed at 100%. In Comparative Example 4 in which the inorganic base was not added, no etching occurred. In addition, when etching was performed according to the comparative examples, a plurality of titanium residues remained, and as shown in FIG. 1, not only a titanium layer but also a copper layer deposited therewith was etched, and thus, it was confirmed that the etchant compositions were inappropriate for protecting other metal layers such as a copper layer.

According to the present disclosure, not only a titanium-containing metal layer may be selectively rapidly etched, but also a corrosion prevention effect for other metal layers including a silicon insulation layer, a copper-based metal layer, and the like may be implemented.

According to the present disclosure, a pH change in a chemical is small with the implementation of stable etching characteristics, and a bubble generation problem due to the decomposition of hydrogen peroxide may be solved. In addition, since a quaternary ammonium salt which may cause over-etching of a titanium-containing metal layer or residues by a reaction with hydrogen peroxide may not be included, a titanium-containing metal layer may be more stably etched.

According to the present disclosure, damage of an upper layer and a lower layer such as a silicon wafer, a silicon insulation layer, and a copper-based metal layer is minimized, thereby stably performing a subsequent process.

In particular, according to the present disclosure, a precisely controlled titanium layer may be provided without damage of the upper layer and the lower layer described above. Thus, poor electrical device characteristics, for example, short circuit, poor wiring, reduced luminance, and the like, which may occur during a subsequent process, may be prevented.

The etchant composition according to the present disclosure may be useful for an etching process through selective etching of a titanium layer and a manufacturing method of a semiconductor device including the etching process.

Hereinabove, although the present disclosure has been described by specific matters and the limited examples and comparative examples, they have been provided only for assisting the entire understanding of the present disclosure, and the present disclosure is not limited to the exemplary embodiments, and various modifications and changes may be made by those skilled in the art to which the present disclosure pertains from the description. Therefore, the spirit of the present disclosure should not be limited to the above-described exemplary embodiments, and the following claims as well as all modified equally or equivalently to the claims are intended to fall within the scope and spirit of the disclosure.

What is claimed is:

1. An etchant composition for a titanium-containing metal layer comprising: a polyvalent phosphonic acid or a salt thereof, an inorganic base, a sulfonic acid-based polymer compound, hydrogen peroxide, and a remaining amount of water, wherein the sulfonic acid-based polymer compound is included at 0.001 to 0.1 wt %.

2. The etchant composition for a titanium-containing metal layer of claim 1, wherein the sulfonic acid-based polymer compound has a molecular weight of 10,000 to 50,000 g/mol.

3. The etchant composition for a titanium-containing metal layer of claim 1, wherein the polyvalent phosphonic acid or the salt thereof is included at 0.01 to 5 wt % with respect to the total weight of the composition.

4. The etchant composition for a titanium-containing metal layer of claim 1, wherein the inorganic base is included at 0.1 to 3 wt % with respect to the total weight of the composition.

5. The etchant composition for a titanium-containing metal layer of claim 1, wherein the sulfonic acid-based polymer compound is represented by the following Chemical Formula 1:

[Chemical Formula 1]

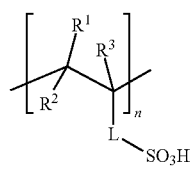

wherein $R^1$ to $R^3$ are independently of one another selected from hydrogen, C1-C7 linear or branched alkyl groups, and halogen elements; L is a direct bond or C1-C10 alkylene, in which —CH$_2$— of the alkylene may be replaced with C6-C12 aryl, —C(=O)—, —NR'—, or a combination thereof, and R' is hydrogen or C1-C7 alkyl; and n is an integer of 30 to 1000.

6. The etchant composition for a titanium-containing metal layer of claim 1, wherein the etchant composition includes: 0.01 to 3 wt % of the polyvalent phosphonic acid or the salt thereof; 0.5 to 3 wt % of the inorganic base; 0.001 to 0.1 wt % of the sulfonic acid-based polymer compound; 15 to 25 wt % of the hydrogen peroxide; and a remaining amount of water, based on the total weight of the etchant composition.

7. The etchant composition for a titanium-containing metal layer of claim 1, wherein the etchant composition does not include a quaternary ammonium salt.

8. The etchant composition for a titanium-containing metal layer of claim 1, wherein the etchant composition has a pH of 7 to 11.

9. The etchant composition for a titanium-containing metal layer of claim 1, further comprising: a phosphate-based compound.

10. The etchant composition for a titanium-containing metal layer of claim 9, wherein the phosphate-based compound is included at 0.01 to 2 wt %, based on the total weight of the etchant composition.

11. The etchant composition for a titanium-containing metal layer of claim 9, wherein a weight ratio between the phosphate-based compound and the inorganic base is 1:3 to 1:15.

12. An etching method of a titanium-containing metal layer, the method comprising: bringing the etchant composition of claim 1 into contact with a titanium-containing metal layer.

13. A manufacturing method of a semiconductor device, the method comprising:
   forming a titanium-containing metal layer on a substrate on which a source electrode, a gate electrode, and a drain electrode have been formed; and
   etching the titanium containing metal layer with the etchant composition of claim 1.

14. The manufacturing method of a semiconductor device of claim 13, further comprising: after the forming of a titanium-containing metal layer, forming a silicon insulation layer and a monolayer of one or a multilayer of two or more selected from second A metal layers on a part of a surface of the titanium containing metal layer.

15. The manufacturing method of a semiconductor device of claim 13, wherein the second metal layer is a monolayer or a multilayer including one or more metals selected from copper, molybdenum, tungsten, titanium, tantalum, chromium, neodymium, niobium, nickel, indium, and tin.

16. The manufacturing method of a semiconductor device of claim 13, further comprising: after the etching, annealing the titanium-containing metal layer.

* * * * *